US012805392B2

(12) United States Patent
Chen et al.

(10) Patent No.: US 12,805,392 B2
(45) Date of Patent: Nov. 17, 2026

(54) MICRO LED DISPLAY DEVICE

(71) Applicant: AUO Corporation, Hsin-Chu (TW)

(72) Inventors: Hung-Yin Chen, Hsin-Chu (TW); Cheng-Yeh Tsai, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 602 days.

(21) Appl. No.: 18/090,182

(22) Filed: Dec. 28, 2022

(65) Prior Publication Data

US 2024/0021594 A1 Jan. 18, 2024

(30) Foreign Application Priority Data

Jul. 18, 2022 (TW) .................................. 111126922

(51) Int. Cl.

| | |
|---|---|
| ***H10W 90/00*** | (2026.01) |
| ***H10H 20/85*** | (2025.01) |
| ***H10H 20/851*** | (2025.01) |
| ***H10H 20/855*** | (2025.01) |

(52) U.S. Cl.

CPC ........ *H10W 90/00* (2026.01); *H10H 20/8506* (2025.01); *H10H 20/8515* (2025.01)

(58) Field of Classification Search

CPC ............... H01L 25/167; H01L 25/0756; H01L 25/0753; H10H 20/8506; H10H 20/8515; H10H 20/855; H10H 20/851; H10H 20/84; H10W 90/00

See application file for complete search history.

(56) References Cited

U.S. PATENT DOCUMENTS

| | | | | |
|---|---|---|---|---|
| 8,390,009 | B2 * | 3/2013 | Wang | H10H 20/858 438/22 |
| 9,091,415 | B2 * | 7/2015 | Bessho | H10H 20/8515 |
| 10,134,802 | B2 * | 11/2018 | El-Ghoroury | H10H 29/14 |

(Continued)

FOREIGN PATENT DOCUMENTS

| | | | |
|---|---|---|---|
| CN | 204067432 U | | 12/2014 |
| CN | 104716264 A | * | 6/2015 |

(Continued)

OTHER PUBLICATIONS

Office Action issued by (TIPO) Intellectual Property Office Ministry of Economic Affairs R.O.C. on Mar. 16, 2023 for Application No. 111126922, Tawian.

(Continued)

*Primary Examiner* — Monica D Harrison
*Assistant Examiner* — Jacob T Nelson
(74) *Attorney, Agent, or Firm* — Tim Tingkang Xia, Esq.; Troutman Pepper Locke LLP

(57) ABSTRACT

A micro LED display device includes a carrier, a first light-emitting unit, a first transparent substrate, a second light-emitting unit and a dichroic filtering layer. The first light-emitting unit is disposed on the carrier and is used to emit a first color light. The first transparent substrate is disposed on the first light-emitting unit. The second light-emitting unit is disposed on the first transparent substrate and is used to emit a second color light. The dichroic filtering layer is disposed between the first light-emitting unit and the first transparent substrate. The dichroic filtering layer is used to allow the first color light to pass therethrough and block the second color light.

8 Claims, 10 Drawing Sheets

(56) References Cited

U.S. PATENT DOCUMENTS

| | | | | |
|---|---|---|---|---|
| 10,879,419 | B2 * | 12/2020 | Jang | H10H 20/833 |
| 12,100,696 | B2 * | 9/2024 | Chae | H10H 29/142 |
| 2008/0251799 | A1 * | 10/2008 | Ikezawa | H10W 90/00<br>257/89 |
| 2015/0280075 | A1 * | 10/2015 | Chang | H10H 20/84<br>257/88 |
| 2019/0164945 | A1 * | 5/2019 | Chae | H10H 20/018 |
| 2019/0304960 | A1 * | 10/2019 | Ko | H10W 90/00 |

FOREIGN PATENT DOCUMENTS

| | | | | | |
|---|---|---|---|---|---|
| CN | 204441334 | U | | 7/2015 | |
| CN | 109417119 | A | | 3/2019 | |
| CN | 110603639 | A | | 12/2019 | |
| CN | 112655099 | A | * | 4/2021 | H10W 90/00 |
| CN | 213782019 | U | | 7/2021 | |
| TW | 201807815 | A | | 3/2018 | |

OTHER PUBLICATIONS

Office Action issued by the China National Intellectual Property Administration for Application No. 202211596089.3, China, Jan. 9, 2026.

* cited by examiner

MICRO LED DISPLAY DEVICE

CROSS-REFERENCE TO RELATED PATENT APPLICATION

This non-provisional application claims priority to and the benefit of, pursuant to 35 U.S.C. § 119(a), patent application Serial No. 111126922 filed in Taiwan on Jul. 18, 2022. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a micro light-emitting diode (LED) display device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A micro LED display device is one of the existing common display devices. The micro LED display device is used in a wide range, which may be used in televisions, panels, wearable devices, augmented reality (AR) devices, virtual reality (VR) devices, etc. The micro LED display device may be formed by a plurality of pixel units arranged in an array. Each pixel unit may be formed by light-emitting units emitting light in different colors, and an embankment structure may be provided around each light-emitting unit to prevent the light of the light-emitting unit from entering adjacent light-emitting units, thus enhancing the color purity of the pixel units.

SUMMARY

Certain embodiments of the present disclosure provide a micro light-emitting diode (LED) display device, which includes a carrier, a first light-emitting unit, a first transparent substrate, a second light-emitting unit and a dichroic filtering layer. The first light-emitting unit is disposed on the carrier and is configured to emit a first color light. The first transparent substrate is disposed on the first light-emitting unit. The second light-emitting unit is disposed on the first transparent substrate and is configured to emit a second color light. The dichroic filtering layer is disposed between the first light-emitting unit and the first transparent substrate. The dichroic filtering layer is configured to allow the first color light to pass therethrough and block the second color light.

In certain embodiments, the first light-emitting unit includes a chip and a wavelength converting layer. The chip is disposed on the carrier, and is configured to emit a third color light. The wavelength converting layer covers the chip, and is configured to convert the third color light emitted by the chip to the first color light.

In certain embodiments, the first light-emitting unit includes a chip. The chip is disposed on the carrier, and is configured to emit the first color light.

In certain embodiments, the first light-emitting unit further includes an adhesive material, disposed between the chip and the dichroic filtering layer.

In certain embodiments, the second light-emitting unit includes a chip and a wavelength converting layer. The chip is disposed on the first transparent substrate, and is configured to emit a third color light. The wavelength converting layer covers the chip, and is configured to convert the third color light emitted by the chip to the second color light.

In certain embodiments, the second light-emitting unit includes a chip. The chip is disposed on the first transparent substrate, and is configured to emit the second color light.

In certain embodiments, the micro LED display device further includes a second transparent substrate and a third light-emitting unit. The second transparent substrate is disposed on the second light-emitting unit. The third light-emitting unit is disposed on the second transparent substrate. The third light-emitting unit is configured to emit a third color light, and the third color light is different from the first color light and the second color light. The dichroic filtering layer is configured to block the third color light.

In certain embodiments, the micro LED display device further includes a color resisting layer, disposed on the second light-emitting unit. The color resisting layer is configured to allow the first color light and the second color light to pass therethrough, and to absorb the third color light.

In certain embodiments, the micro LED display device further includes a first embankment structure and a second embankment structure. The first embankment structure surrounds the first light-emitting unit and the dichroic filtering layer, and the second embankment structure surrounds the second light-emitting unit and the color resisting layer.

In certain embodiments, the micro LED display device further includes a first light absorbing layer and a second light absorbing layer. The first light absorbing layer is disposed between the first transparent substrate and the second embankment structure. The second light absorbing layer is disposed on the second transparent substrate and surrounding the third light-emitting unit.

In certain embodiments, the second transparent substrate further surrounds the second light-emitting unit, and the first transparent substrate further surrounds the first light-emitting unit.

Certain embodiments of the present disclosure relate to a display device in which the light-emitting units are stacked in a vertical direction. When the display device according to certain embodiments of the present disclosure is used, it is ensured that the red light, green light and blue light of the display device may emit upward, and the area of the display device on the carrier may be reduced, thus allowing more display devices in a unit area, such as the LED packages.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The detailed features and advantages of the present disclosure are described below in great detail through the following embodiments, and the content of the detailed description is sufficient for persons skilled in the art to understand the technical content of the present invention and to implement the present invention there accordingly. Based upon the content of the specification, the claims, and the drawings, persons skilled in the art can easily understand the relevant objectives and advantages of the present invention. The following embodiments further describe the viewpoints of the present invention, but are not intended to limit the scope of the present invention in any way.

Certain embodiments of the present disclosure relate to a display device in which the light-emitting units are stacked in a vertical direction. When the display device according to certain embodiments of the present disclosure is used, it is ensured that the red light, green light and blue light of the display device may emit upward, and the area of the display device on the carrier may be reduced, thus allowing more pixel units in a unit area. Certain embodiments of the present disclosure is suited to a display device using micro LED chips.

Figure 1A:
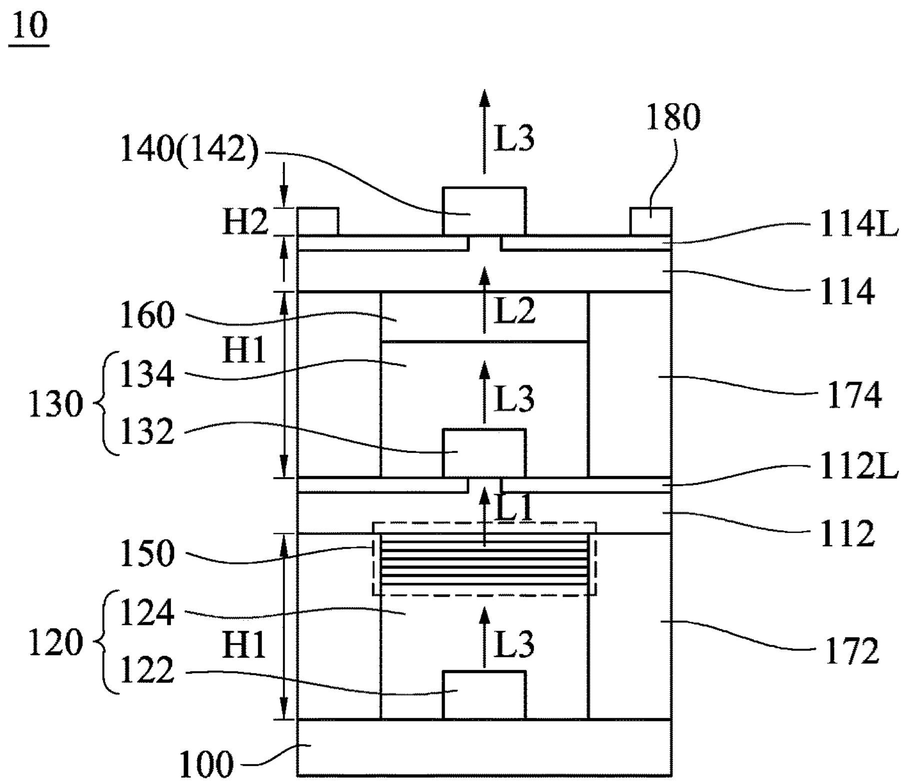
FIG. 1A is a cross-sectional view of a display device according to certain embodiments of the present disclosure.
Figure 1B:
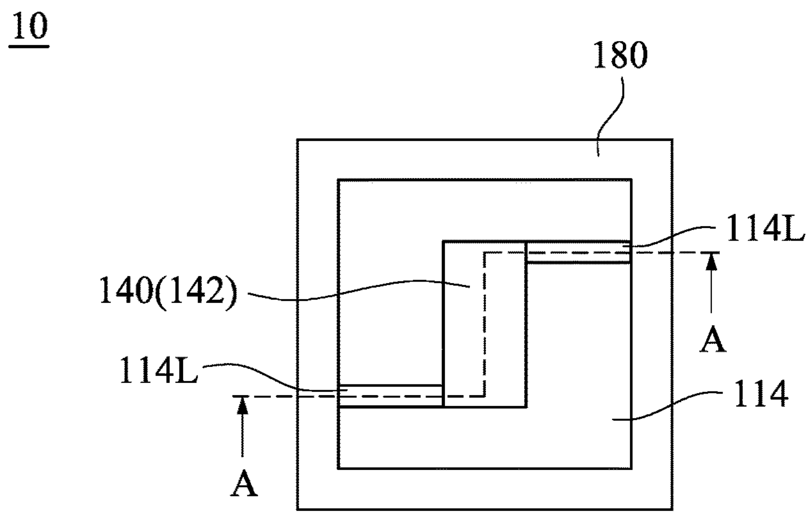
FIG. 1B is a top view of a display device according to certain embodiments of the present disclosure.

FIG. 1A is a cross-sectional view of a display device 10 according to certain embodiments of the present disclosure, FIG. 1B is a top view of a display device 10 according to certain embodiments of the present disclosure, and FIG. 1A is a cross-sectional view illustrated along a line A-A of FIG. 1B. The micro LED display device 10 may include a carrier 100, a first light-emitting unit 120, a first transparent substrate 112, a second light-emitting unit 130, a second transparent substrate 114, a third light-emitting unit 140, a dichroic filtering layer 150 and a color resisting layer 160.

Figure 2:
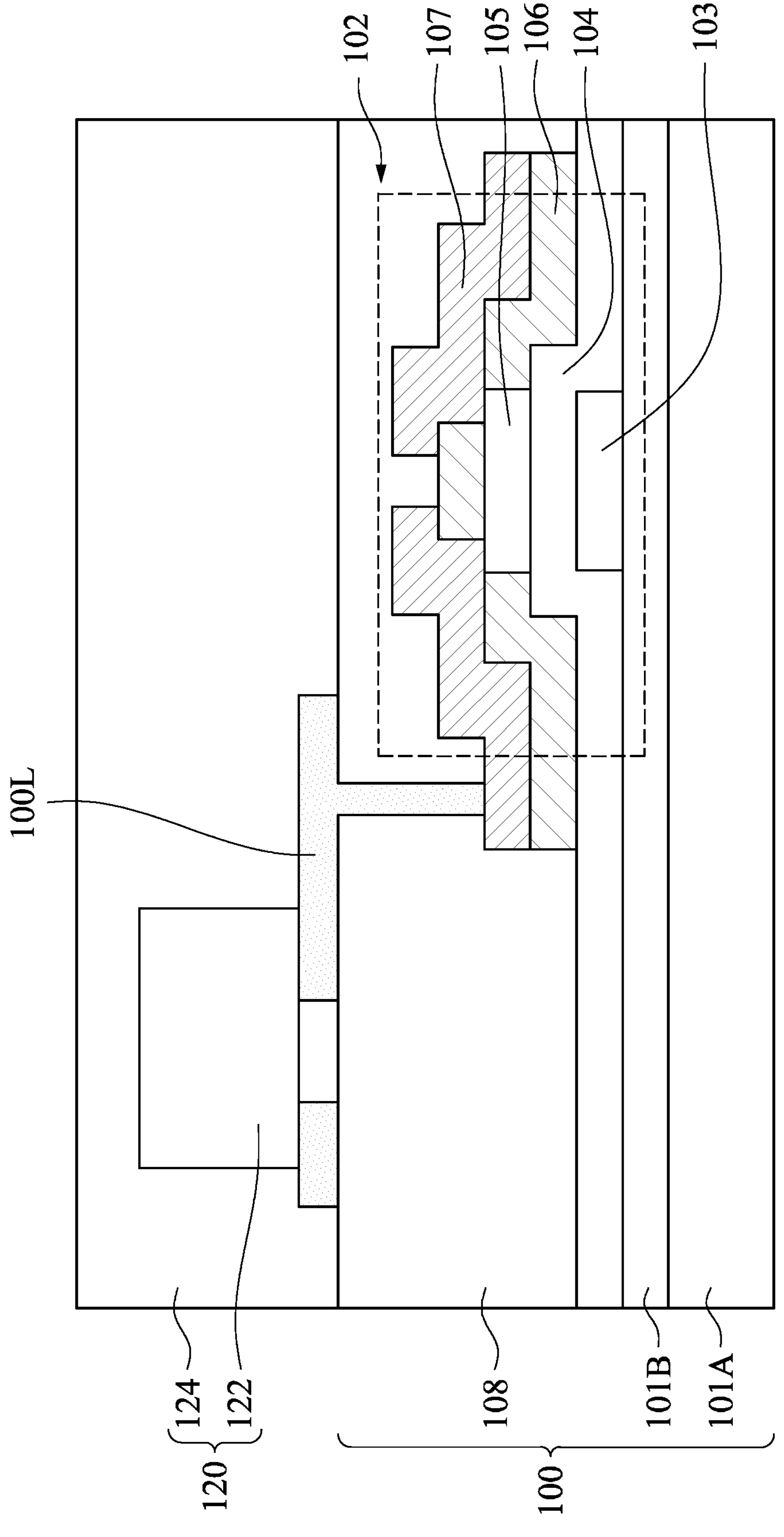
FIG. 2 is a cross-sectional view of a carrier and a first light-emitting unit according to certain embodiments of the present disclosure.

FIG. 2 is a cross-sectional view of a carrier 100 and a first light-emitting unit 120 according to certain embodiments of the present disclosure. In certain embodiments, the carrier 100 may be an array substrate, and the carrier 100 may have a substrate 101A, a buffer layer 101B and a plurality of active components 102 (FIG. 2 illustrating one active component 102 as an example). The buffer layer 101B may be formed on the substrate 101A. The active components 102 may be formed on the buffer layer 101B. The active components 102 are electrically connected to the first light-emitting unit 120. The active components 102 may include a gate electrode 103, a gate dielectric layer 104, a channel layer 105, a dielectric 106 and source/drain electrodes 107. The carrier 100 may further include an insulating layer 108 covering the active components 102 and a conducting wire layer 100L on the insulating layer 108, and the conducting wire layer 100L may be electrically connected to the first light-emitting unit 120 and the source/drain electrodes 107 of the active components 102.

Referring back to FIG. 1A, in certain embodiments, the first transparent substrate 112 and the second transparent substrate 114 may be array substrates similar to the carrier 100, and the first transparent substrate 112 and the second transparent substrate 114 respectively have conducting wire layers 112L and 114L similar to the conducting wire layer 100L (illustrated in FIG. 2). The conducting wire layer 112L of the first transparent substrate 112 may electrically connect the second light-emitting unit 130 to the active components of the first transparent substrate 112, and the conducting wire layer 114L of the second transparent substrate 114 may electrically connect the third light-emitting unit 140 to the active components of the second transparent substrate 114. In certain embodiments, the first transparent substrate 112 and the second transparent substrate 114 may be glass substrates, polyimide (PI) substrates or other suitable substrates. In certain embodiments, the carrier 100 may be an opaque substrate, but the present disclosure does not limit the carrier 100 to be the opaque substrate. In certain other embodiments, the carrier 100 may be a transparent substrate, such as a glass substrate, a PI substrate or other suitable substrates. In certain other embodiments, the conducting wire layer of the first transparent substrate 112 and the conducting wire layer of the second transparent substrate 114 may be further pulled to the carrier 100, such that the second light-emitting unit 130 and the third light-emitting unit 140 may be electrically connected to the other active components of the carrier 100 through the conducting wire layers. In certain embodiments, the conducting wire layers 100L, 112L and 114L may be manufactured by any suitable conductive materials, such as metal or indium tin oxide (ITO).

The first light-emitting unit 120 is disposed on the carrier 100, and the first light-emitting unit 120 is configured to emit a first color light L1. The first transparent substrate 112 is disposed on the first light-emitting unit 120. The second light-emitting unit 130 is disposed on the first transparent substrate 112, and the second light-emitting unit 130 is configured to emit a second color light L2. The second color light L2 and the first color light L1 are different. The second transparent substrate 114 is disposed on the second light-emitting unit 130. The third light-emitting unit 140 is disposed on the second transparent substrate 114, and the third light-emitting unit 140 is configured to emit a third color light L3. The third color light L3 is different from the first color light L1 and the second color light L2. In other words, the third light-emitting unit 140 covers the second light-emitting unit 130, and the second light-emitting unit 130 covers the first light-emitting unit 120.

Specifically, the first light-emitting unit 120 may include a chip 122 and a wavelength converting layer 124. The chip 122 is disposed on the carrier 100, and is configured to emit the third color light L3. The wavelength converting layer 124 covers the chip 122, and is configured to convert the third color light L3 emitted by the chip 122 to the first color light L1. The second light-emitting unit 130 may include a chip 132 and a wavelength converting layer 134. The chip 132 is disposed on the first transparent substrate 112, and is configured to emit the third color light L3. The wavelength converting layer 134 covers the chip 132, and is configured to convert the third color light L3 emitted by the chip 132 to the second color light L2. The third light-emitting unit 140 may include a chip 142. The chip 142 is disposed on the second transparent substrate 114, and is configured to emit the third color light L3. That is, the chip 122 of the first light-emitting unit 120, the chip 132 of the second light-emitting unit 130 and the chip 142 of the third light-emitting unit 140 may emit light in the same color.

In certain embodiments, the first color light L1 may be red light, the second color light L2 may be green light and the third color light L3 may be blue light. Thus, the first light-emitting unit 120 emitting the red light, the second light-emitting unit 130 emitting the green light and the third light-emitting unit 140 emitting the blue light are arranged vertically upward. Specifically, the first light-emitting unit 120 may include the chip 122 of the blue light and the wavelength converting layer 124 of the red light. The chip 122 of the blue light is disposed on the carrier 100. The wavelength converting layer 124 of the red light covers the chip 122 of the blue light, and is configured to convert the blue light emitted by chip 122 of the blue light to the red light. The wavelength converting layer 124 of the red light may include wavelength converting materials, such as quantum dots, phosphor powders or similar objects, thus converting the blue light with a shorter wavelength to the red light. The second light-emitting unit 130 may include the chip 132 of the blue light and the wavelength converting layer 134 of the green light. The chip 132 of the blue light is disposed on the first transparent substrate 112. The wavelength converting layer 134 of the green light covers the chip 132 of the blue light, and is configured to convert the blue light emitted by chip 132 of the blue light to the green light. The wavelength converting layer 134 of the red light may include wavelength converting materials, such as quantum dots, phosphor powders or similar objects, thus converting the blue light with a shorter wavelength to the green light. The third light-emitting unit 140 may include the chip 142 of the blue light, and the chip 142 of the blue light is disposed on the second transparent substrate 114.

The dichroic filtering layer 150 is disposed between the first light-emitting unit 120 and the first transparent substrate 112, and the dichroic filtering layer 150 is configured to allow the first color light L1 to pass therethrough and block the second color light L2 and the third color light L3. The color resisting layer 160 is disposed on the second light-emitting unit 130, and the color resisting layer 160 is configured to allow the first color light L1 and the second color light L2 to pass therethrough, and to absorb the third color light L3. In other words, the carrier 100, the first light-emitting unit 120, the dichroic filtering layer 150, the first transparent substrate 112, the second light-emitting unit 130, the color resisting layer 160, the second transparent substrate 114 and the third light-emitting unit 140 are vertically arranged upward from bottom thereof.

The micro LED display device 10 further includes a first embankment structure 172 and a second embankment structure 174. The second embankment structure 174 is located above the first embankment structure 172. The first embankment structure 172 surrounds the first light-emitting unit 120 and the dichroic filtering layer 150. The second embankment structure 174 surrounds the second light-emitting unit 130 and the color resisting layer 160. The first embankment structure 172 may be used to reflect the light from the first light-emitting unit 120, and the second embankment structure 174 may be used to reflect the light from the second light-emitting unit 130. Thus, the first embankment structure 172 and the second embankment structure 174 may ensure light from the first light-emitting unit 120 and the second light-emitting unit 130 are emitted upward, and the light from the first light-emitting unit 120 and the second light-emitting unit 130 does not enter the adjacent light-emitting units. In certain embodiments, the first embankment structure 172 and the second embankment structure 174 have a reflectivity of 60% or more to light with a wavelength in the range from 380 nm to 780 nm, and have a permeability of 30% or less to the light with the wavelength in the range from 380 nm to 780 nm and an absorbance of 10% or less to the light with the wavelength in the range from 380 nm to 780 nm. In certain embodiments, the heights H1 of the first embankment structure 172 and the second embankment structure 174 are between 10 μm and 25 μm.

The micro LED display device 10 further includes a light absorbing layer 180, and the light absorbing layer 180 may be disposed on the second transparent substrate 114 and surround the third light-emitting unit 140. When the light from the second light-emitting unit 130 passes through the second transparent substrate 114, the light absorbing layer 180 may be used to absorb the light not entering the third light-emitting unit 140, such as the light passing through the second transparent substrate 114 or the second embankment structure 174. Thus, light concentration of the micro LED display device may be ensured. In certain embodiments, the light absorbing layer 180 is manufactured by metal. In certain embodiments, the light absorbing layer 180 has a reflectivity of 95% or more to light with the wavelength in the range from 380 nm to 780 nm, and has both a permeability and an absorbance of 5% or less to the light with the wavelength in the range from 380 nm to 780 nm. In certain embodiments, a height H2 of the light absorbing layer 180 is between 1 μm and 5 μm.

Figure 3A:
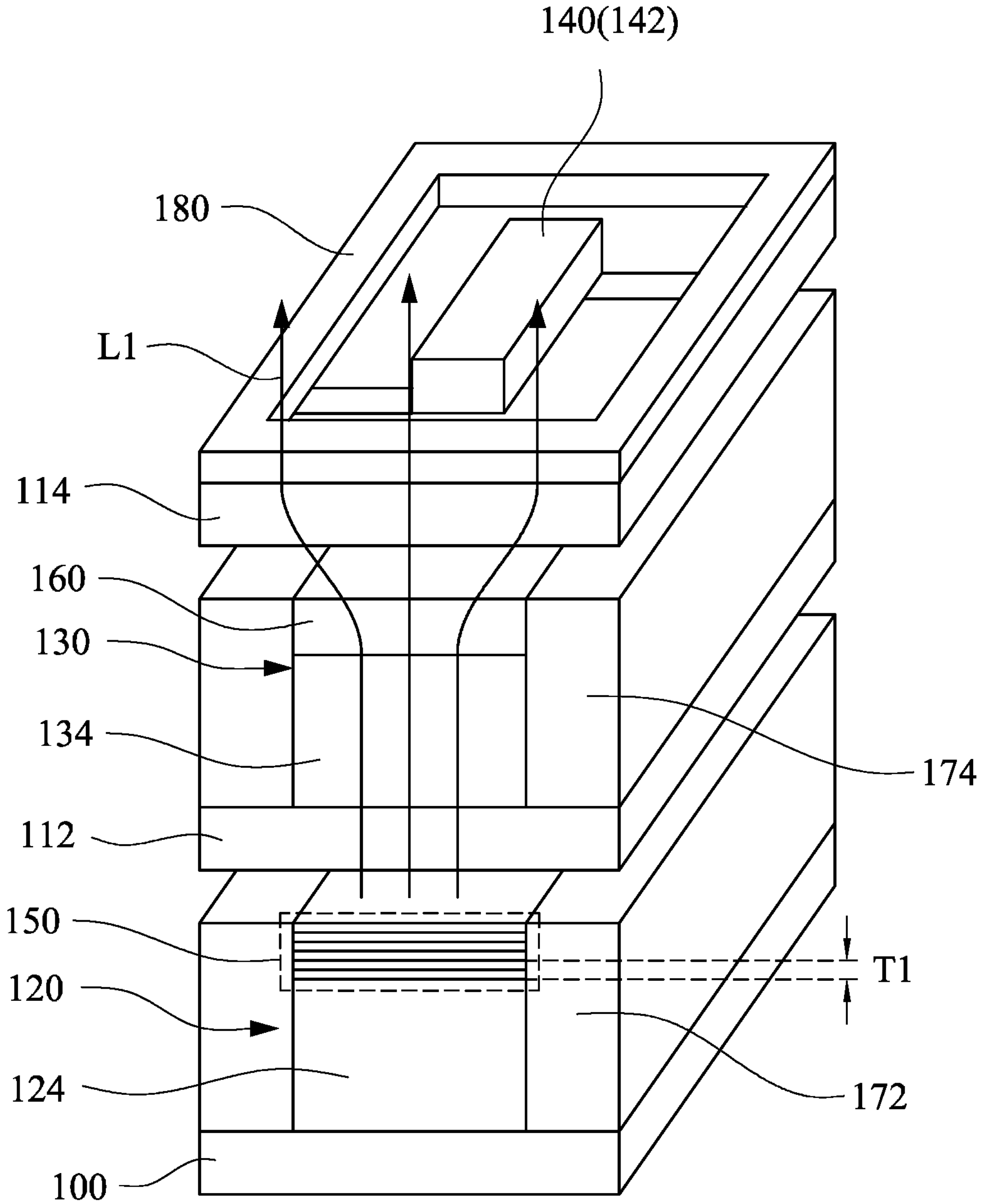
FIG. 3A to FIG. 3C illustrate schematic views of paths of the first color light, the second color light and the third color light in the display device.
Figure 3B:
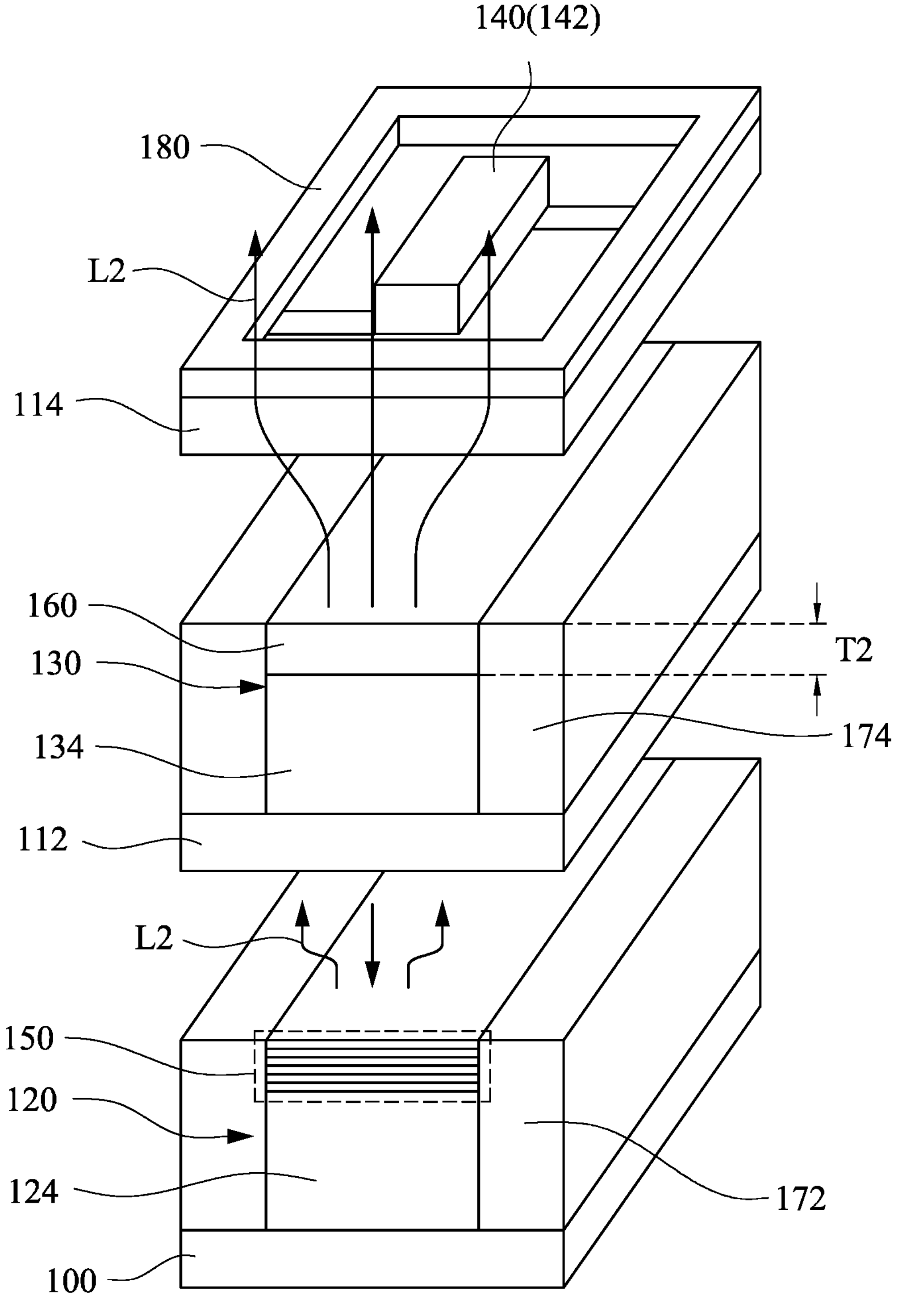
Figure 3C:
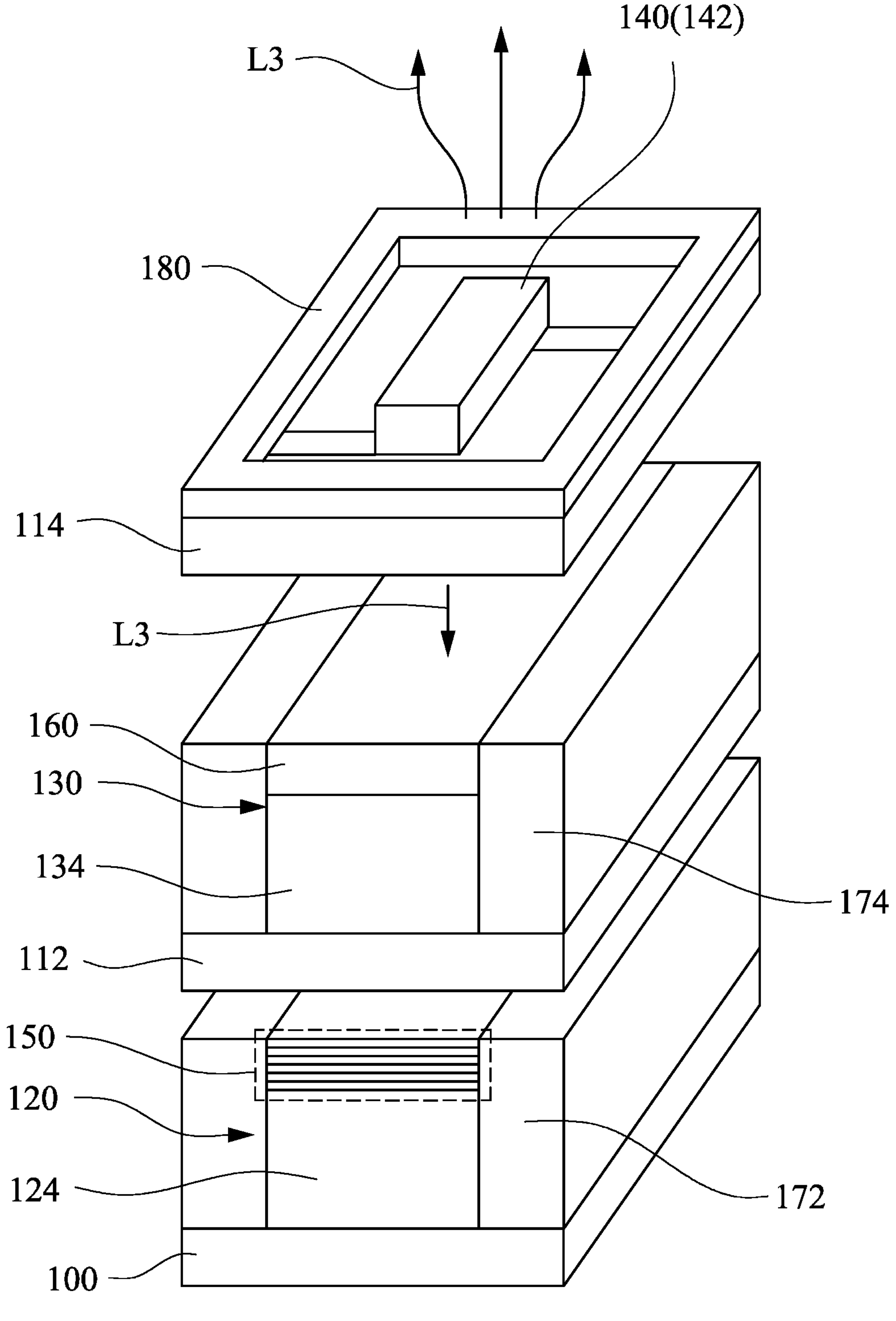

FIG. 3A to FIG. 3C illustrate schematic views of paths of the first color light L1, the second color light L2 and the third color light L3 in the micro LED display device 10. For clarity purposes, the components of the micro LED display device 10 in FIG. 3A to FIG. 3C are in the disassembled state, thus clearly showing the light in each color to penetrate/reflect between the components. As shown in FIG. 3A, the first color light L1 emitted by the first light-emitting unit 120 is emitted upward. Since the dichroic filtering layer 150 is located on the first light-emitting unit 120, the dichroic filtering layer 150 may allow the first color light L1 to pass therethrough, thus entering the second light-emitting unit 130 on the dichroic filtering layer 150. Since the dichroic filtering layer 150 cannot allow the third color light L3 (illustrated in FIG. 1A) to pass therethrough, the dichroic filtering layer 150 may reflect some of the third color light not converted by the wavelength converting materials in the wavelength converting layer 124, such that the few third color light of the first light-emitting unit 120 does not move upward to enter the second light-emitting unit 130. After the first color light L1 enters the second light-emitting unit 130, since the color resisting layer 160 allows the first color light L1 to pass therethrough, the first color light L1 may further enter the third light-emitting unit 140. In certain embodiments, the dichroic filtering layer 150 may be a distributed Bragg reflector (DBR), and has a reflectivity of 95% or more, a permeability of 3% or less and an absorbance of 3% or less to light with a wavelength in the range from 430 nm to 470 nm (such as the blue light) and light with a wavelength in the range from 490 nm to 560 nm (such as the green light), and a reflectivity of 5% or less, a permeability of 95% or more and an absorbance of 5% or less to light with a wavelength in the range from 600 nm to 700 nm (such as the red light). In certain embodiments, the dichroic filtering layer 150 may be formed by a plurality of pairs (such as 5 pairs) of sub-filtering layers (with each pair of the sub-filtering layers including materials of different refractive index), and the thickness of each pair of the sub-filtering layers is 0.1 μm.

As shown in FIG. 3B, the second color light L2 emitted by the second light-emitting unit 130 is emitted upward and downward. Since the dichroic filtering layer 150 is located below the second light-emitting unit 130, the dichroic filtering layer 150 may block and reflect the second color light L2 emitted downward from the second light-emitting unit 130, thus increasing the upward light emission of the second color light L2. Further, the dichroic filtering layer 150 may block and reflect some of the third color light not converted by the wavelength converting materials in the wavelength converting layer 134 and emitted downward, thus preventing the third color light from being converted to the first color light by the wavelength converting layer 124 above and causing crosstalk issues. Further, the color resisting layer 160 is located above the second light-emitting unit 130, so the color resisting layer 160 may allow the second color light L2 of the second light-emitting unit 130 to pass therethrough and enter the third light-emitting unit 140 above the color resisting layer 160. Since the color resisting layer 160 cannot allow the third color light L3 (illustrated in FIG. 1A) to pass therethrough, the color resisting layer 160 may absorb some of the third color light not converted by the wavelength converting materials in the wavelength converting layer 134, such that the few third color light of the second light-emitting unit 130 does not move upward to enter the third light-emitting unit 140. In certain embodiments, the color resisting layer 160 is a yellow color resist, and has a reflectivity of 10% or less, a permeability of 83% or more and an absorbance of 5% or less to light with a wavelength in the range from 490 nm to 780 nm (such as the green light and the red light), and a reflectivity of 5% or less, a permeability of 3% or less and an absorbance of 95% or more to light with a wavelength in the range from 430 nm to 470 nm (such as the blue light). In certain embodiments, the thickness T2 of the color resisting layer 160 is between 5 μm and 15 μm. In certain embodiments, the color resisting layer 160 may be replaced by a distributed Bragg reflector, and the distributed Bragg reflector may allow the first color light and the second color light L2 to pass therethrough, and reflect the third color light.

As shown in FIG. 3C, the third color light L3 emitted by the third light-emitting unit 140 is emitted upward and downward. Since the light resisting layer 160 is located below the third light-emitting unit 140, the light resisting layer 160 may absorb the third color light L3 emitted downward from the third light-emitting unit 140, thus preventing the third color light L3 from being converted by the wavelength converting layer 134 below. Thus, the first color light emitted by the first light-emitting unit 120, the second color light emitted by the second light-emitting unit 130 and the third color light L3 emitted by the third light-emitting unit 140 are all emitted upward. The first light-emitting unit 120, the second light-emitting unit 130 and third light-emitting unit 140 may be viewed as a pixel. Further, the first light-emitting unit 120, the second light-emitting unit 130 and third light-emitting unit 140 in the same pixel are arranged vertically upward, such that the area of the micro LED display device 10, that is, the area occupied by each pixel, may become smaller.

Figure 4A:
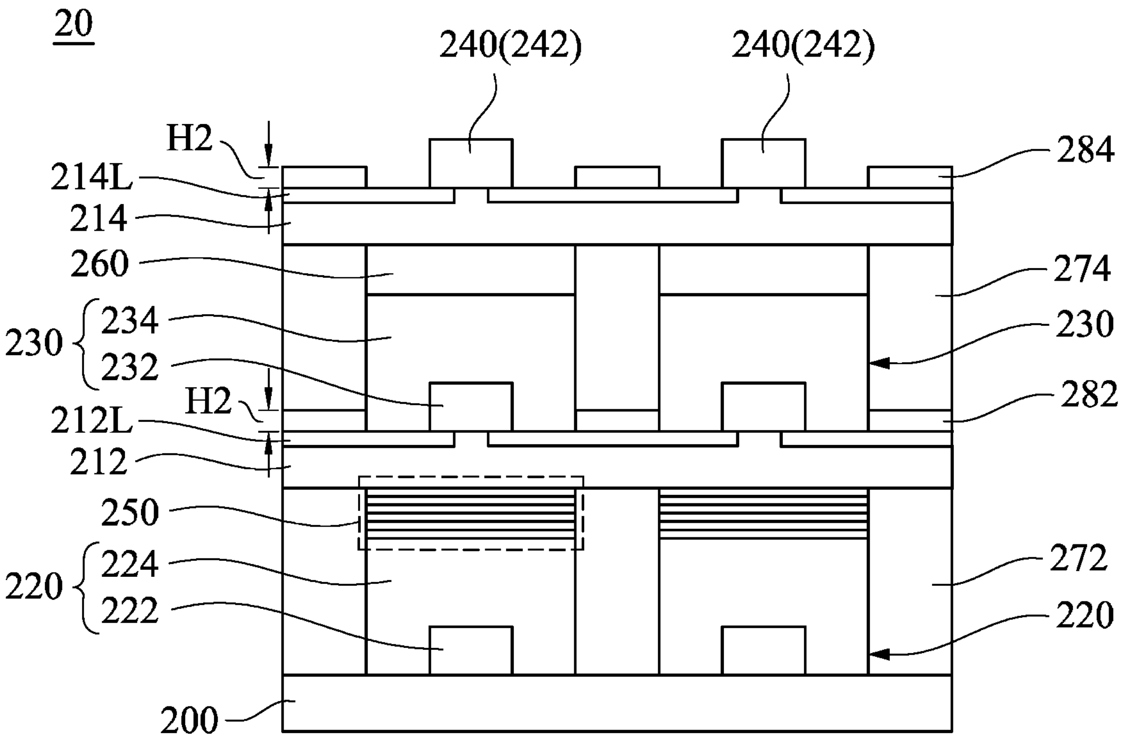
FIG. 4A is a cross-sectional view of a display device according to certain embodiments of the present disclosure.
Figure 4B:
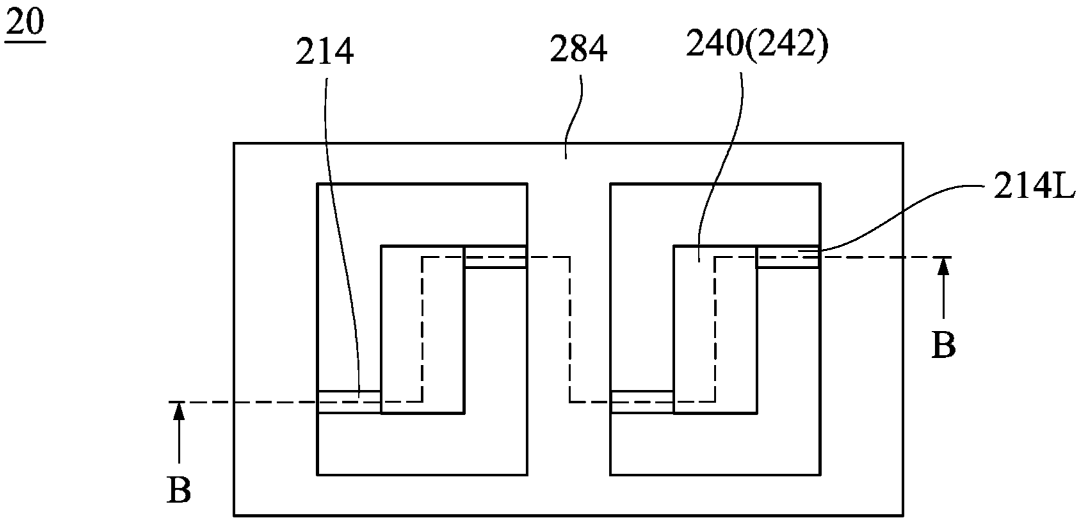
FIG. 4B is a top view of a display device according to certain embodiments of the present disclosure.

FIG. 4A is a cross-sectional view of a micro LED display device 20 according to certain embodiments of the present disclosure, FIG. 4B is a top view of a micro LED display device 20 according to certain embodiments of the present disclosure, and FIG. 4A is a cross-sectional view illustrated along a line B-B of FIG. 4B. The micro LED display device 20 includes a carrier 200, a first light-emitting unit 220, a first transparent substrate 212, a dichroic filtering layer 250, a second light-emitting unit 230, a second transparent substrate 214, a color resisting layer 260, a third light-emitting unit 240, a first embankment structure 272, a second embankment structure 274, a first absorbing layer 282 and a second absorbing layer 284. The first light-emitting unit 220 includes a chip 222 and a wavelength converting layer 224, the second light-emitting unit 230 includes a chip 232 and a wavelength converting layer 234, and the third light-emitting unit 240 includes a chip 242. The first transparent substrate 212 has a conducting wire layer 212L, and the second transparent substrate 214 has a conducting wire layer 214L. The structure of the micro LED display device 20 is similar to the structure of the micro LED display device 10, and the differences exist in that the micro LED display device 20 may have the first absorbing layer 282 and the second absorbing layer 284.

The carrier 200 of the micro LED display device 20 may have two or more first light-emitting units 220, the first transparent substrate 212 of the micro LED display device 20 may have two or more second light-emitting units 230, and the second transparent substrate 214 of the micro LED display device 20 may have two or more third light-emitting units 240. Each first light-emitting unit 220 is aligned to a second light-emitting unit 230 in the vertical direction, and each second light-emitting unit 230 is aligned to a third light-emitting unit 240 in the vertical direction. Thus, the first light-emitting units 220 on the carrier 200, the second light-emitting units 230 on the first transparent substrate 212 and the third light-emitting units 240 on the second transparent substrate 214 may form a plurality of pixel units, and are tiled to be a large display device, such as a display panel, an augmented reality device and/or a virtual reality device. Since the first light-emitting units 220, the second light-emitting units 230 and the third light-emitting units 240 of the micro LED display device 20 are arranged upward along the vertical direction, the area occupied by each pixel unit is reduced, thus enhancing the pixel density of the display device.

Further, the first embankment structure 272 and the second embankment structure 274 may be used to prevent the light from the first light-emitting units 220 and the second light-emitting units 230 from entering the adjacent first light-emitting units 220 and the second light-emitting units 230, and to enhance the color purity of the light emitted by each pixel unit. The first embankment structure 272 and the second embankment structure 274 stacked along the vertical direction may reduce the area occupied by each pixel unit, thereby enhancing the pixel density of the display device, and the first embankment structure 272 and the second embankment structure 274 have sufficient thicknesses to reflect the light from the first light-emitting units 220 and the second light-emitting units 230.

The micro LED display device 20 may have the first absorbing layer 282 and the second absorbing layer 284. The first light absorbing layer 282 is disposed between the first transparent substrate 212 and the second embankment structure 274. The second light absorbing layer 284 is disposed on the second transparent substrate 214 and surrounds the third light-emitting unit 240. When the light of the first light-emitting unit 220 passes through the first transparent substrate 212, the first absorbing layer 282 may be used to absorb the light not entering the second light-emitting unit 230, such as the light passing through the first transparent substrate 212 or the first embankment structure 272. When the light of the second light-emitting unit 230 passes through the second transparent substrate 214, the second absorbing layer 284 may be used to absorb the light not entering the third light-emitting unit 240, such as the light passing through the second transparent substrate 214 or the second embankment structure 274. Thus, the light concentration of the micro LED display device 20 may be ensured. In certain embodiments, the heights H2 of the first absorbing layer 282 and the second absorbing layer 284 is between 1 μm and 5 μm. Other corresponding details of the micro LED display device 20 are similar to those of the micro LED display device 10, and are thus not hereinafter elaborated.

Figure 5A:
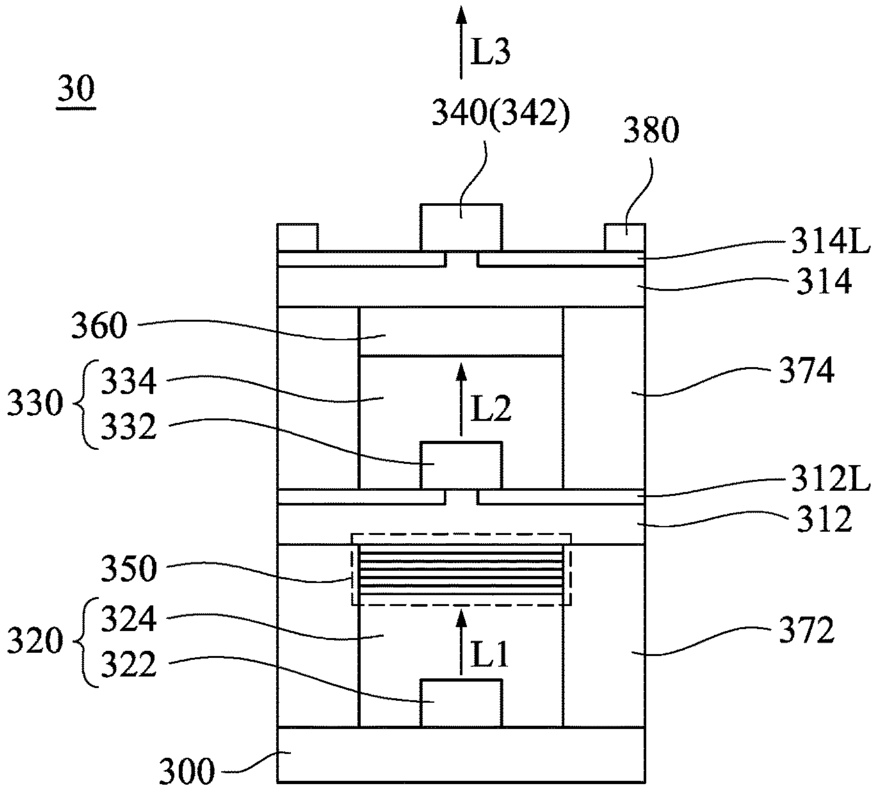
FIG. 5A is a cross-sectional view of a display device according to certain embodiments of the present disclosure.
Figure 5B:
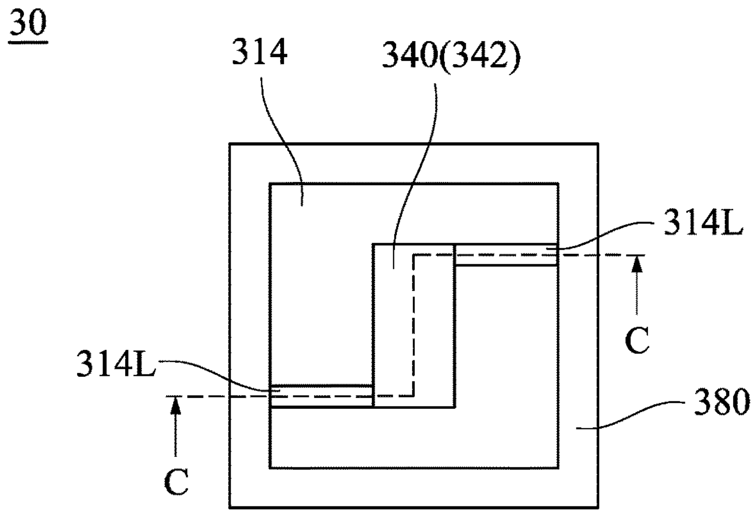
FIG. 5B is a top view of a display device according to certain embodiments of the present disclosure.

FIG. 5A is a cross-sectional view of a micro LED display device 30 according to certain embodiments of the present disclosure, FIG. 5B is a top view of a micro LED display device 30 according to certain embodiments of the present disclosure, and FIG. 5A is a cross-sectional view illustrated along a line C-C of FIG. 5B. The micro LED display device 30 includes a carrier 300, a first light-emitting unit 320, a first transparent substrate 312, a dichroic filtering layer 350, a second light-emitting unit 330, a second transparent substrate 314, a color resisting layer 360, a third light-emitting unit 340, a first embankment structure 372, a second embankment structure 374 and an absorbing layer 380. The first transparent substrate 312 has a conducting wire layer 312L, and the second transparent substrate 314 has a conducting wire layer 314L. The third light-emitting unit 340 includes a chip 342. The structure of the micro LED display device 30 is similar to the structure of the micro LED display device 10, and the differences exist in that the structures of the first light-emitting unit 320 and the second light-emitting structure 330 are different from the structures of the first light-emitting unit 120 and the second light-emitting structure 130.

Specifically, the first light-emitting unit 320 may include a chip 322 and an adhesive material 324, The chip 322 is disposed on the carrier 300, and is configured to emit the first color light L1, such as the red light. The adhesive material 324 is disposed between the chip 322 and the dichroic filtering layer 350. The second light-emitting unit 330 may include a chip 332 and an adhesive material 334, The chip 332 is disposed on the first transparent substrate 312, and is configured to emit the second color light L2, such as the green light. The adhesive material 334 is disposed between the chip 332 and the color resisting layer 360. The adhesive material 324 and the adhesive material 334 may include no wavelength converting materials, so the adhesive material 324 and the adhesive material 334 do not convert the first color light L1 emitted by the chip 322 and the second color light L2 emitted by the chip 332. That is, the first color light L1 emitted by the chip 322 may pass through the dichroic filtering layer 350 and enter the second light-emitting unit 330, and then pass through the color resisting layer 360 and enter the third light-emitting unit 340. The second color light L2 emitted by the chip 332 may be reflected by the dichroic filtering layer 350 and emit upward, and then pass through the color resisting layer 360 and enter the third light-emitting unit 340. Other corresponding details of the micro LED display device 30 are similar to those of the micro LED display device 10, and are thus not hereinafter elaborated.

Figure 6A:
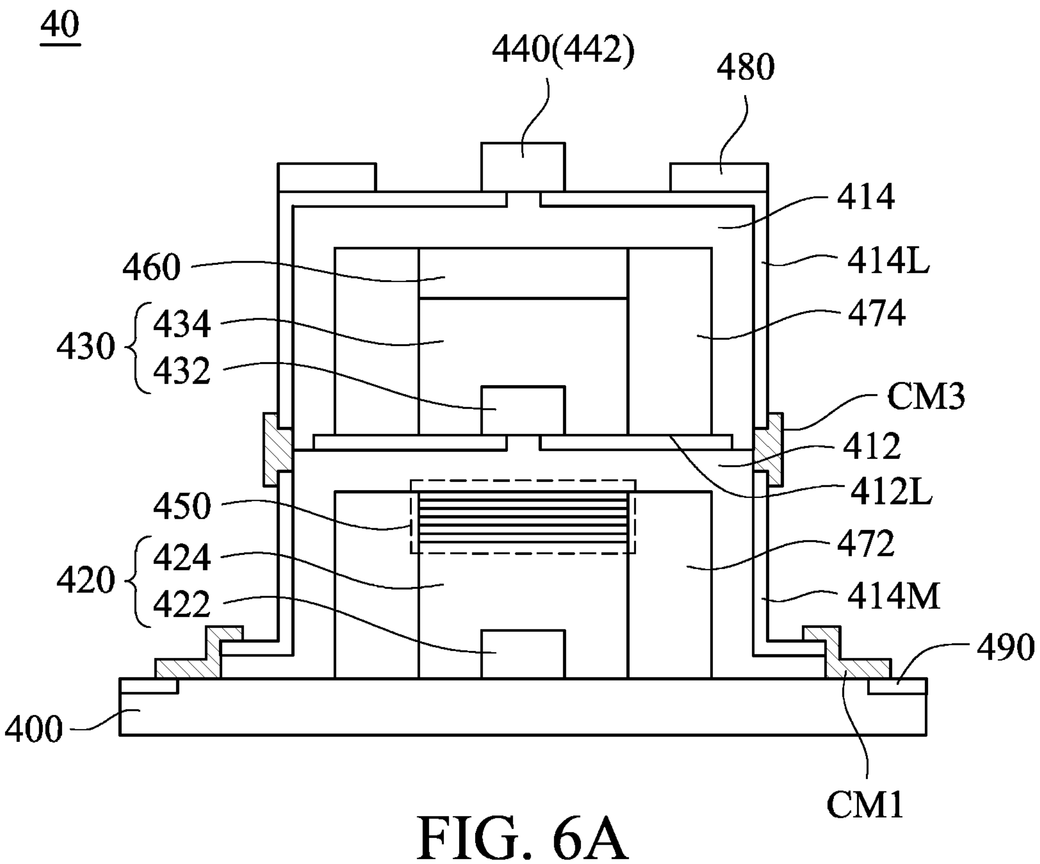
FIG. 6A is a cross-sectional view of a display device according to certain embodiments of the present disclosure.
Figure 6B:
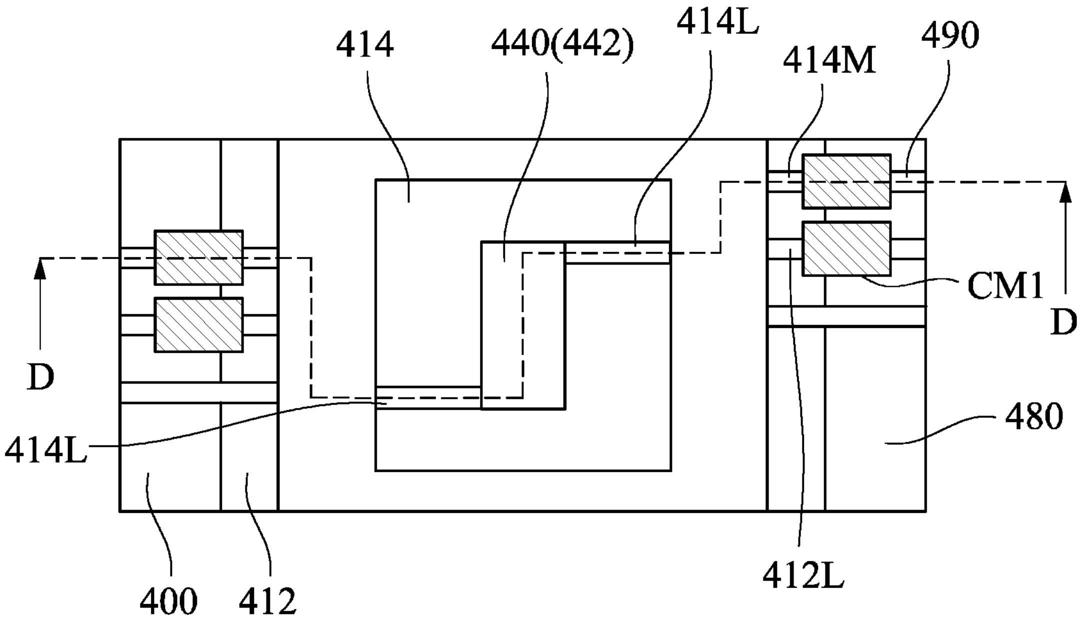
FIG. 6B is a top view of a display device according to certain embodiments of the present disclosure.
Figure 7:
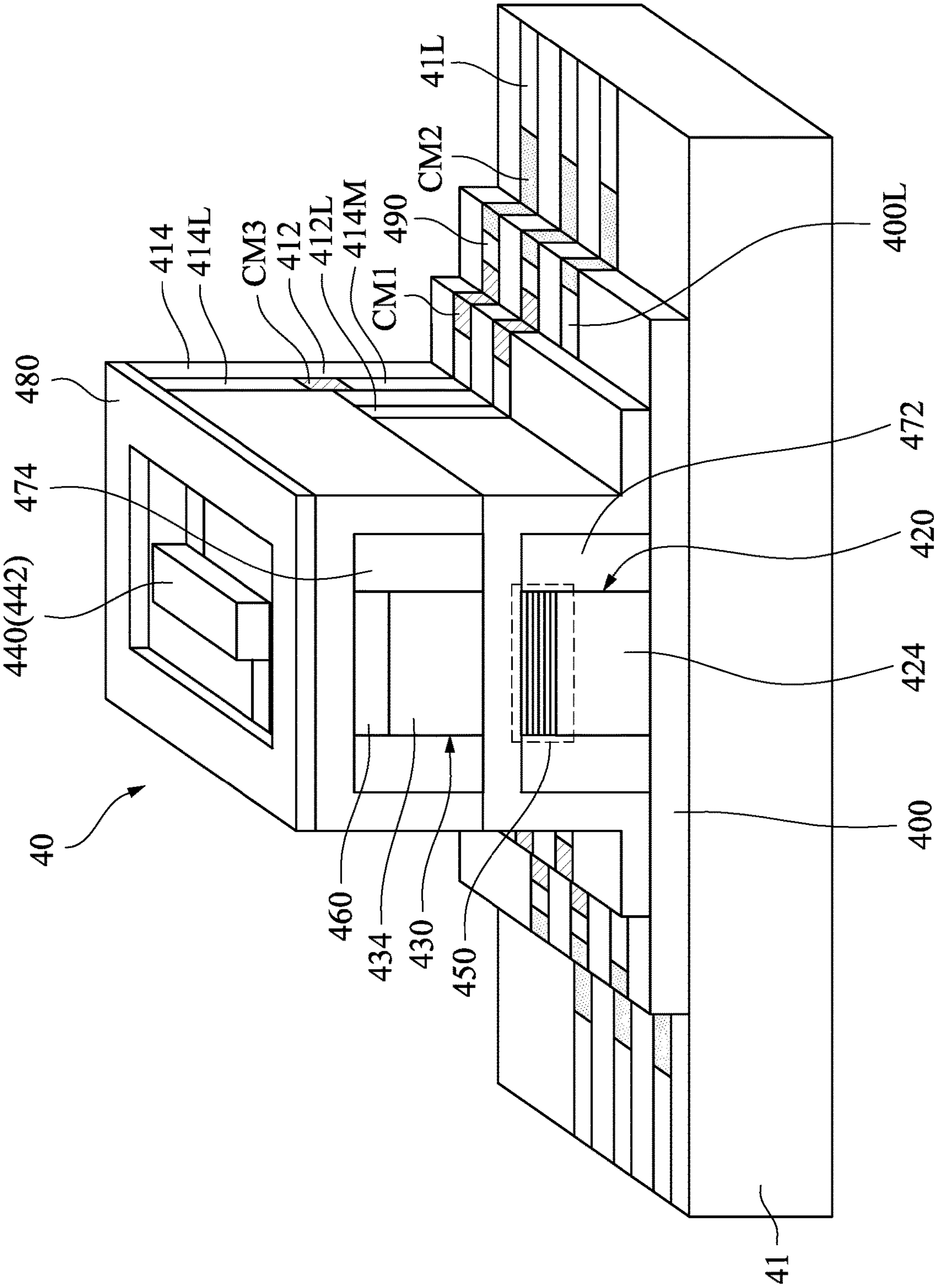
FIG. 7 is a schematic view of a display device according to certain embodiments of the present disclosure, where the display device is transferred to a backplate.

FIG. 6A is a cross-sectional view of a micro LED display device 40 according to certain embodiments of the present disclosure, FIG. 6B is a top view of a micro LED display device 40 according to certain embodiments of the present disclosure, and FIG. 6A is a cross-sectional view illustrated along a line D-D of FIG. 6B. FIG. 7 is a schematic view of a micro LED display device 40 being transferred to a backplate 41 according to certain embodiments of the present disclosure. The micro LED display device 40 includes a carrier 400, a first light-emitting unit 420, a first transparent substrate 412, a dichroic filtering layer 450, a second light-emitting unit 430, a second transparent substrate 414, a color resisting layer 460, a third light-emitting unit 440, a first embankment structure 472, a second embankment structure 474 and an absorbing layer 480. The first light-emitting unit 420 includes a chip 422 and a wavelength converting layer 424, the second light-emitting unit 430 includes a chip 432 and a wavelength converting layer 434, and the third light-emitting unit 440 includes a chip 442. The first transparent substrate 412 has a conducting wire layer 412L and a conducting wire layer 414M, and the second transparent substrate 414 has a conducting wire layer 414L. The structure of the micro LED display device 40 is similar to the structure of the micro LED display device 10, and the differences exist in that the first transparent substrate 412 and the second transparent substrate 414 of the micro LED display device 40 are bendable substrates, and the carrier 400 does not include an active component array.

Specifically, the first transparent substrate 412 may bend downward, such that the first transparent substrate 412 further surrounds the first light-emitting unit 420 and is in contact with the side wall of the first embankment structure 472. Thus, the conducting wire layer 412L of the first transparent substrate 412 starts from the second light-emitting unit 430, extends downward along the first transparent substrate 412, and is electrically connected to the conductive pad 490 on the carrier 400 through the conductive material CM1. The second first transparent substrate 414 may bend downward, such that the second transparent substrate 414 further surrounds the second light-emitting unit 430 and is in contact with the side wall of the second embankment structure 474. Thus, the conducting wire layer 414L of the second transparent substrate 414 starts from the third light-emitting unit 440, extends downward along the second transparent substrate 414, and is electrically connected to the conducting wire layer 414M of the first transparent substrate 412 through the conductive material CM3. The conducting wire layer 414M of the first transparent substrate 412 extends downward along the first transparent substrate 412, and is electrically connected to the conductive pad 490 on the carrier 400 through the conductive material CM1. Thus, the micro LED display device 40 may be an independent package, and may serve as an independent pixel. Thus, the micro LED display device 40 may easily be transferred to an expected backplate based on the need. Since the first light-emitting unit 420, the second light-emitting unit 430 and the third light-emitting unit 440 of the micro LED display device 40 are arranged upward along the vertical direction, the area occupied by each pixel unit is reduced, thus enhancing the pixel density of the display device.

Referring to FIG. 7, the backplate 41 may include a plurality of active components, and an upper surface of the backplate 41 may include a conductive pad 41L electrically connected to the active components. When the micro LED display device 40 is transferred to the backplate 41, the conductive pad 490 of the micro LED display device 40 connected to the second light-emitting unit 430 and the third light-emitting unit 440 is electrically connected to the conductive pad 41L of the backplate 41 through the conductive material CM2. The conducting wire layer 400L connected to the first light-emitting unit 420 is also electrically connected to the conductive pad 41L of the backplate 41 through the conductive material CM2. In certain embodiments, the conductive materials CM1, CM2 and CM3 may be manufactured by conductive materials such as indium tin oxide, metal, etc. The first light-emitting unit 420, the second light-emitting unit 430 and the third light-emitting unit 440 of the micro LED display device 40 may be electrically connected to the conductive pad 41L of the backplate 41. It should be noted that, although FIG. 7 only illustrates one micro LED display device 40, FIG. 7 is merely an example. In certain embodiments, there may be a plurality of micro LED display devices 40 on the backplate 41, and the micro LED display devices 40 may be tiled on the backplate 41 to form a large display device, such as a display panel, an augmented reality device and/or a virtual reality device. Since each micro LED display device 40 is an independent package, when one of the display devices 40 is broken, the broken micro LED display device 40 may be easily identified, and the broken micro LED display device 40 may be removed. Thus, another good micro LED display device 40 may be transferred to the backplate 41 without damaging the conductive pad 41L on the backplate 41.

Figure 8:
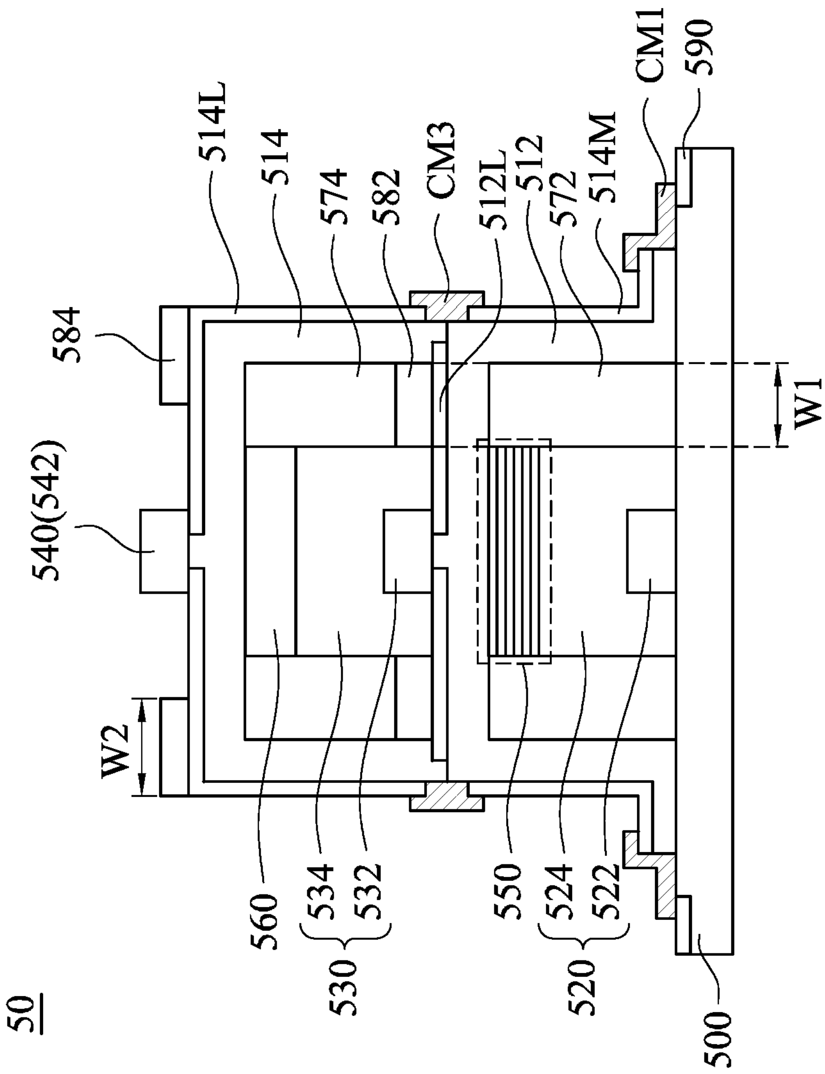
FIG. 8 is a cross-sectional view of a display device according to certain embodiments of the present disclosure.

FIG. 8 is a cross-sectional view of a micro LED display device 50 according to certain embodiments of the present disclosure. The micro LED display device 50 includes a carrier 500, a first light-emitting unit 520, a first transparent substrate 512, a dichroic filtering layer 550, a second light-emitting unit 530, a second transparent substrate 514, a color resisting layer 560, a third light-emitting unit 540, a first embankment structure 572, a second embankment structure 574, a first absorbing layer 582, a second absorbing layer 584, a conductive pad 590, a conductive material CM1 and a conductive material CM3. The first light-emitting unit 520 includes a chip 522 and a wavelength converting layer 524, the second light-emitting unit 530 includes a chip 532 and a wavelength converting layer 534, and the third light-emitting unit 540 includes a chip 542. The first transparent substrate 512 has conducting wire layers 512L and 514M, and the second transparent substrate 514 has a conducting wire layer 514L. The structure of the micro LED display device 50 is similar to the structure of the micro LED display device 40, and the differences exist in that the micro LED display device 50 includes the first absorbing layer 582 and the second absorbing layer 584. The first light absorbing layer 582 is disposed between the first transparent substrate 512 and the second embankment structure 574. The first light absorbing layer 582 has a width W1, the second light absorbing layer 584 has a width W2, and the width W2 of the second light absorbing layer 584 is wider than the width W1 of the first light absorbing layer 582, thus absorbing the light passing through the second transparent substrate 514 or the second embankment structure 574. The details of the first absorbing layer 582 and the second absorbing layer 584 are similar to the first absorbing layer 282 and the second absorbing layer 284 of the micro LED display device 20, and are thus not hereinafter elaborated.

In sum, in certain embodiments of the present disclosure, the light-emitting units emitting light in different colors are stacked in the vertical direction, such that the area occupied by each pixel unit becomes smaller. Further, in each pixel unit, the embankment structures surrounding different light-emitting units are also arranged vertically. Thus, the embankment structures do not occupy too much area in the horizontal direction, and the embankment structures may have sufficient thicknesses to prevent the light of the light-emitting units from entering adjacent light-emitting units. Thus, the color purity of the pixel units may be enhanced, and the pixel density of each display device is simultaneously increased.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A micro light-emitting diode (LED) display device, comprising:

- a carrier;
- a first light-emitting unit, disposed on the carrier, wherein the first light-emitting unit comprises:
  - a chip, disposed on the carrier, and configured to emit a third color light; and
  - a wavelength converting layer, covering the chip of the first light-emitting unit, and configured to convert the third color light emitted by the chip of the first light-emitting unit to a first color light;
- a first transparent substrate, disposed on the first light-emitting unit;
- a second light-emitting unit, disposed on the first transparent substrate, wherein the second light-emitting unit comprises:
  - a chip, disposed on the first transparent substrate, and configured to emit the third color light; and
  - a wavelength converting layer, covering the chip of the second light-emitting unit, and configured to convert the third color light emitted by the chip of the second light-emitting unit to a second color light, and the second color light is different from the first color light;
- a second transparent substrate, covering the second light-emitting unit;
- a third light-emitting unit, disposed on the second transparent substrate, wherein the second transparent substrate is disposed between the third light-emitting unit and the second light-emitting unit, the third light-emitting unit includes a chip disposed on the second transparent substrate and configured to emit the third color light, and the third color light is different from the first color light and the second color light;

a color resisting layer, disposed on the second light-emitting unit, wherein the color resisting layer is configured to allow the first color light and the second color light to pass therethrough, and to absorb the third color light;

a dichroic filtering layer, disposed between the first light-emitting unit and the first transparent substrate, wherein the dichroic filtering layer is configured to allow the first color light to pass therethrough and block the second color light and the third color light;

a first embankment structure, disposed on the carrier and surrounding the first light-emitting unit and the dichroic filtering layer, wherein the first embankment structure and the first light-emitting unit are disposed on a same side of the carrier;

a second embankment structure, disposed on the first transparent substrate and surrounding the second light-emitting unit and the color resisting layer, wherein the second embankment structure and the second light-emitting unit are disposed on a same side of the first transparent substrate;

a first light absorbing layer, disposed between the first transparent substrate and the second embankment structure; and a second light absorbing layer, disposed on the second transparent substrate and surrounding the third light-emitting unit, wherein a width of the second light absorbing layer is wider than a width of the first light absorbing layer;

wherein the first-emitting unit, the second light-emitting unit and the third light-emitting unit are arranged in a vertical direction, the first embankment structure is overlapped with the second embankment structure along the vertical direction, and a projection of the first light absorbing layer along the vertical direction and a projection of the second light absorbing layer along the vertical direction do not overlap with the first-emitting unit, the second light-emitting unit and the third light-emitting until;

wherein the carrier, the first light-emitting unit, the first transparent substrate, the second light-emitting unit, the second transparent substrate, and third light-emitting unit are arranged in sequence along the vertical direction;

wherein the first embankment structure, the first light absorbing layer, the second embankment structure, and the second light absorbing layer are arranged in sequence along the vertical direction; and wherein the projection of the first light absorbing layer and the projection of the second light absorbing layer along the vertical direction overlap with the first embankment structure and the second embankment structure.

2. The micro LED display device according to claim 1, wherein the first light-emitting unit further comprises:

an adhesive material, disposed between the chip and the dichroic filtering layer.

3. The micro LED display device according to claim 1, wherein the second transparent substrate further surrounds the second light-emitting unit, and the first transparent substrate further surrounds the first light-emitting unit.

4. The micro LED display device according to claim 3, wherein the first transparent substrate is in contact with a side wall of the first embankment structure.

5. The micro LED display device according to claim 4, wherein the second transparent substrate is in contact with a side wall of the second embankment structure.

6. The micro LED display device according to claim 3, wherein the first transparent substrate includes a first conducting wire layer, the second transparent substrate includes a second conducting wire layer, and the second conducting wire layer extends downward along the second transparent substrate and is electrically connected to the first conducting wire layer through a conductive material.

7. The micro LED display device according to claim 6, wherein the first conducting wire layer extends downward along the first transparent substrate and is electrically connected to a conductive pad on the carrier through another conductive material.

8. The micro LED display device according to claim 1, wherein the second light-emitting unit further comprises:

an adhesive material, disposed between the chip and the color resisting layer.

* * * * *